(12) United States Patent
Jamison et al.

(10) Patent No.: US 10,697,876 B1
(45) Date of Patent: Jun. 30, 2020

(54) FLUID ANALYSIS DEVICES WITH SHEAR STRESS SENSORS

(71) Applicant: Halliburton Energy Services, Inc., Houston, TX (US)

(72) Inventors: Dale E. Jamison, Humble, TX (US); Xiangnan Ye, Cypress, TX (US); Andrew D. Vos, Spring, TX (US); Marek Kozikowski, Conroe, TX (US)

(73) Assignee: Halliburton Energy Services, Inc., Houston, TX (US)

(*) Notice: Subject to any disclaimer, the term of this patent is extended or adjusted under 35 U.S.C. 154(b) by 0 days.

(21) Appl. No.: 16/510,014

(22) Filed: Jul. 12, 2019

(51) Int. Cl.
| G01N 11/14 | (2006.01) |
| G01N 11/02 | (2006.01) |
| B81B 7/02  | (2006.01) |
| G01N 11/00 | (2006.01) |

(52) U.S. Cl.
CPC ............... *G01N 11/02* (2013.01); *B81B 7/02* (2013.01); *G01N 2011/0033* (2013.01); *G01N 2011/0066* (2013.01)

(58) Field of Classification Search
None
See application file for complete search history.

(56) References Cited

U.S. PATENT DOCUMENTS

| 3,304,528 A | 2/1967 | Rastrelli et al. |
| 3,827,294 A | 8/1974 | Anderson |
| 3,876,972 A | 4/1975 | Garrett |
| 4,062,225 A | 12/1977 | Murphy, Jr. et al. |
| 4,483,197 A | 11/1984 | Kellner |
| 4,592,226 A | 6/1986 | Weber et al. |
| 4,811,597 A | 3/1989 | Hebel |
| 5,163,317 A | 11/1992 | Ono et al. |
| 5,199,298 A | 4/1993 | Ng et al. |
| 5,959,194 A * | 9/1999 | Nenniger ........... G01N 33/2823 73/53.01 |
| 6,341,532 B1 | 1/2002 | Xu et al. |
| 6,418,776 B1 | 7/2002 | Gitis et al. |
| 6,426,796 B1 | 7/2002 | Pulliam et al. |
| 6,499,336 B1 | 12/2002 | Raffer |
| 6,575,025 B1 | 6/2003 | Demia |
| 6,629,451 B1 | 10/2003 | Taylor |
| 6,817,223 B2 | 11/2004 | Lenz |

(Continued)

FOREIGN PATENT DOCUMENTS

| EP | 1712890 A2 | 10/2006 |
| KR | 1020010065206 A | 7/2001 |

(Continued)

OTHER PUBLICATIONS

Acknowledgement receipt and specification for patent application entitled "Lubricity Testing with Shear Stress Sensors," by Dale E. Jamison, et al., filed Jul. 12, 2019 as U.S. Appl. No. 16/510,002.

(Continued)

*Primary Examiner* — Paul M. West
*Assistant Examiner* — Mark A Shabman
(74) *Attorney, Agent, or Firm* — Conley Rose, P.C.; Rodney B. Carroll

(57) ABSTRACT

In some examples, a fluid analysis device (FAD) comprises a fluid chamber comprising an agitator and a shear stress sensor exposed to a surface within the fluid chamber.

4 Claims, 7 Drawing Sheets

(56) References Cited

U.S. PATENT DOCUMENTS

| | | | |
|---|---|---|---|
| 7,311,009 | B2 | 12/2007 | Kotovsky |
| 7,338,202 | B1 | 3/2008 | Kapat et al. |
| 7,526,941 | B2 | 5/2009 | Doe |
| 7,701,586 | B2 | 4/2010 | Otugen et al. |
| 7,757,552 | B2 | 7/2010 | Bogath et al. |
| 8,375,771 | B1 | 2/2013 | Bi |
| 8,794,051 | B2 | 8/2014 | Morgan et al. |
| 9,175,557 | B2 | 11/2015 | Iversen et al. |
| 9,194,784 | B1 | 11/2015 | Bi et al. |
| 9,243,882 | B2 | 1/2016 | Brookfield |
| 9,376,906 | B2 | 6/2016 | Dalvi et al. |
| 9,625,333 | B2 | 4/2017 | Jentoft et al. |
| 9,771,790 | B2 | 9/2017 | Clark et al. |
| 10,024,776 | B2 | 7/2018 | Khosla et al. |
| 10,132,733 | B2 | 11/2018 | Vinogradov-Nurenberg et al. |
| 2002/0070050 | A1 | 6/2002 | Wassell |
| 2003/0154772 | A1* | 8/2003 | Jackson ............. G01N 11/14 73/54.28 |
| 2004/0173009 | A1* | 9/2004 | Doe ............. G01D 3/022 73/54.02 |
| 2008/0092641 | A1 | 4/2008 | Cahill et al. |
| 2009/0188304 | A1 | 7/2009 | Eskin et al. |
| 2010/0004890 | A1 | 1/2010 | Tonmukayakul et al. |
| 2010/0274504 | A1 | 10/2010 | Takahashi et al. |
| 2011/0061451 | A1 | 3/2011 | Harris et al. |
| 2016/0109348 | A1* | 4/2016 | Robert ............. G01F 1/28 73/54.39 |
| 2017/0122820 | A1 | 5/2017 | Peng et al. |
| 2017/0292902 | A1* | 10/2017 | Bardapurkar ......... G01N 13/00 |
| 2018/0038780 | A1* | 2/2018 | Yang ............. G01L 1/00 |
| 2018/0252600 | A1 | 9/2018 | Sheplak et al. |

FOREIGN PATENT DOCUMENTS

| | | |
|---|---|---|
| KR | 101439751 B1 | 9/2014 |
| WO | 8304096 A1 | 11/1983 |
| WO | 2008022960 A1 | 2/2008 |
| WO | 2014150051 A1 | 9/2014 |

OTHER PUBLICATIONS

Acknowledgement receipt and specification for patent application entitled "Measurement of Torque with Shear Stress Sensors," by Dale E. Jamison, et al., filed Jul. 12, 2019 as U.S. Appl. No. 16/510,016.

Acknowledgement receipt and specification for patent application entitled "Measurement of Torque with Shear Stress Sensors," by Andrew D. Vos, et al., filed Jul. 12, 2019 as U.S. Appl. No. 16/510,023.

Office Action dated Aug. 30, 2019 (25 pages), U.S. Appl. No. 16/510,023, filed Jul. 12, 2019.

Office Action dated Sep. 11, 2019 (20 pages), U.S. Appl. No. 16/510,016, filed Jul. 12, 2019.

Office Action dated Sep. 13, 2019 (25 pages), U.S. Appl. No. 16/510,002, filed Jul. 12, 2019.

Foreign communication from a related International Application No. PCT/US2019/044470, International Search Report and Written Opinion, dated Apr. 9, 2020, 11 pages.

Foreign Communication Regarding Related Application—International Search Report and Written Opinion of the International Searching Authority, International Application No. PCT/US2019/044466, dated Apr. 10, 2020, 9 pages.

* cited by examiner

FLUID ANALYSIS DEVICES WITH SHEAR STRESS SENSORS

BACKGROUND

The properties of drilling fluids are often studied during drilling operations to adjust and improve the drilling operations. The viscosity of drilling fluid is one such frequently studied property. Devices known as rheometers and viscometers may be used to measure the viscosity of a particular drilling fluid. By measuring the viscosity of a particular fluid, drilling operations can be enhanced, for example by altering the quantities or ratios of chemicals added to the fluid.

BRIEF DESCRIPTION OF THE DRAWINGS

For a detailed description of various examples, reference will now be made to the accompanying drawings in which.

DETAILED DESCRIPTION

As explained above, rheometers and viscometers are frequently used in the oil and gas context to measure the viscosity of various drilling fluids. Traditional rheometers and viscometers are complex, expensive devices with multiple points of failure. For example, such traditional devices contain mechanical torque sensing systems that indirectly measure a torque response, and the torque measurement is then used to calculate viscosity. Such indirect measurements often produce unreliable results. In addition, the mechanical torque sensing systems tend to be sensitive to high pressures and temperatures, thus limiting the ability to simulate downhole conditions when testing fluids. The mechanical torque sensing systems also tend to use specific bearing designs that are difficult to build and repair. These and other drawbacks associated with the traditional rheometer and viscometer produce considerable difficulty and expense for personnel studying fluids.

Disclosed herein are various examples of fluid analysis devices (FADs) (e.g., rheometers, viscometers) that use shear stress sensors (e.g., micro-electro-mechanical system (MEMS) shear stress sensors) to directly measure shear stress in fluids under test. The shear stress is imparted to the fluid by an agitator using a known, controlled shear rate. Viscosity may then be calculated using the measured shear stress and the known shear rate. Other useful data, such as shear rate-shear stress curves, may be generated by measuring the shear stress response to a range of shear rates. Similarly, various models (e.g., Herschel-Bulkley, Bingham, power law, and Casson models) may be developed using the measurements and known shear rates, and these models may in turn be used to calculate hydraulics for drilling operations. Other uses of the FADs are contemplated and included within the scope of this disclosure. For example, a FAD may be used to determine the yield stress associated with a gel deposited or formed within the FAD. The remainder of this disclosure is primarily described in the context of rheometers, but the features described herein may be adapted for use in viscometers and other FADs as desired and as may be appropriate.

Through their use of MEMS shear stress sensors, the various FADs described herein gain multiple technical advantages. For example, the direct measurement of shear stress eliminates the need for the aforementioned mechanical torque sensing systems, which, in turn, simplifies FAD design, enhances FAD robustness and accuracy, decreases FAD construction complexity and expense, and decreases repair costs. The bearings and springs required in traditional designs, for instance, may be partially or completely omitted in the examples described herein.

Figure 1A:
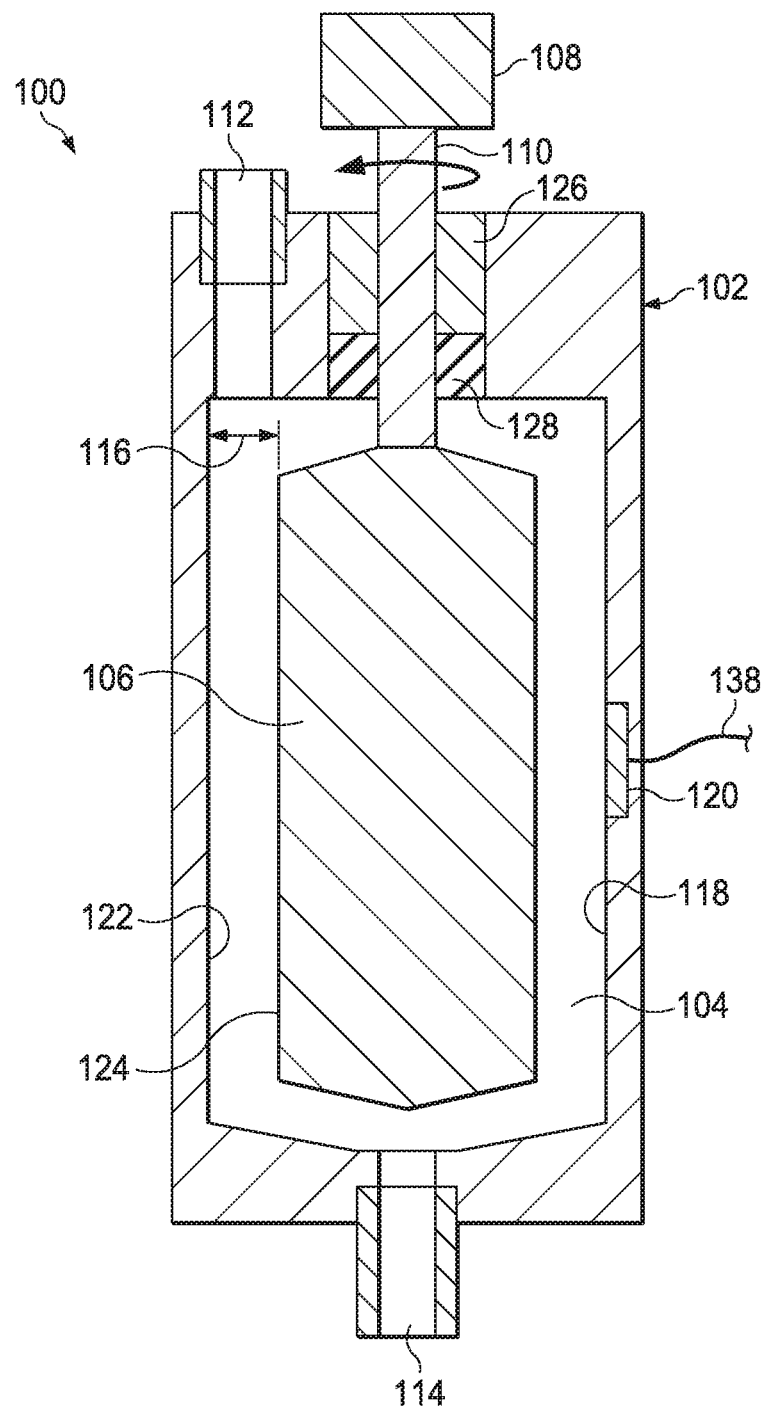
FIGS. 1A-5 are cross-sectional views of illustrative fluid analysis devices, in accordance with various examples.

FIG. 1A is a cross-sectional view of an illustrative FAD 100, in accordance with various examples. The FAD 100 comprises a fluid chamber 102 having a fluid cavity 104. The fluid cavity 104 houses an agitator 106 (e.g., a bob) that couples to and is rotated by a motor 108 via a shaft 110. The shaft 110 abuts a bearing assembly 126, and a seal assembly 128 prevents fluid leakage from the fluid cavity 104. The agitator 106 is separated from an inner surface 122 of the fluid chamber 102 by a distance 116. In some examples, the same distance 116 separates the agitator 106 from an inner surface 118, meaning that the agitator 106 is centered in the fluid cavity 104. (Because the fluid cavity 104 is generally cylindrical, the surfaces 118, 122 are the same inner surface of the fluid cavity 104, but separate numerals are provided to distinguish separate halves of the inner surface to facilitate a description of the position of the agitator 106 within the fluid cavity 104.) The scope of this disclosure, however, is not limited as such, and any suitable position of the agitator 106 is included in the scope of this disclosure. A surface 124 of the agitator 106 may be smooth or may include one or more protrusions to facilitate agitation of the fluid within the fluid cavity 104. In some examples, the agitator 106 comprises a vane.

The fluid chamber 102 further comprises a fluid inlet 112, which may couple to a fluid source, such as a pump. The fluid chamber 102 also comprises a fluid outlet 114, which may couple to a fluid repository, such as the pump or a container from which the pump draws fluid.

A shear stress sensor 120 (e.g., a MEMS shear stress sensor) is exposed to the inner surface of the fluid chamber 102 (e.g., the inner surface 118, 122). A cable 138 couples to the shear stress sensor 120 to facilitate communication between the shear stress sensor 120 and electronics (e.g., a computer) that stores and/or processes the measurements received from the shear stress sensor 120.

Figure 7:
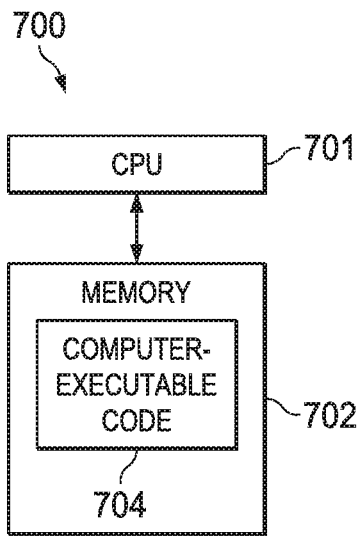
FIG. 7 is a schematic diagram of processing logic usable with the fluid analysis devices described herein, in accordance with various examples.

In operation, the fluid inlet 112 conveys fluid into the fluid cavity 104. The motor 108 rotates the agitator 106 at a known, controlled rate, thus producing a known, controlled shear rate. This shear rate depends in part on the distance 116. At a constant revolutions-per-minute (RPM), a smaller gap produces a larger shear rate compared to a larger gap. Thus, the distance 116 may be considered in tandem with the RPMs of the agitator 106 when determining an appropriate shear rate to apply. This agitation of the fluid imparts a shear stress on the sensing surface of the shear stress sensor 120, which measures the shear stress and outputs an electrical signal indicating the measured shear stress to the cable 138. In some examples, multiple shear stress sensors may be positioned on various surfaces within the fluid cavity 104, including surfaces 118/122, other surfaces of the fluid cavity 104, and the surface 124. A computer (not expressly depicted in FIG. 1, although an example computer is depicted in FIG. 7 and is described below) receives the shear stress measurements via the cable 138 and processes the measurements as desired. For example, the computer may generate a shear rate-shear stress curve to depict the shear stress response to a range of shear rates imparted by the motor 108 and the agitator 106. In some examples, the computer may calculate a viscosity value by dividing the measured shear stress by the known shear rate. The computer may generate one or more models using the shear stress measurements and/or known shear rate(s), including Herschel-Bulkley, Bingham, power law, and Casson models. These models may be used for any of a variety of purposes, e.g., to calculate hydraulics for drilling operations. In some examples, the computer may be used for other functions. For example, the computer may control the motor 108 and thus the shear rate produced by the agitator 106. Fluid may exit the fluid cavity 104 via the fluid outlet 114. In some examples, high temperature and/or high pressure conditions may be simulated in the FAD 100 by heating, cooling, and/or pressurizing the fluid conveyed into the fluid cavity 104. For example, high pressure pumps and heaters may be used to simulate downhole conditions.

Figure 1B:
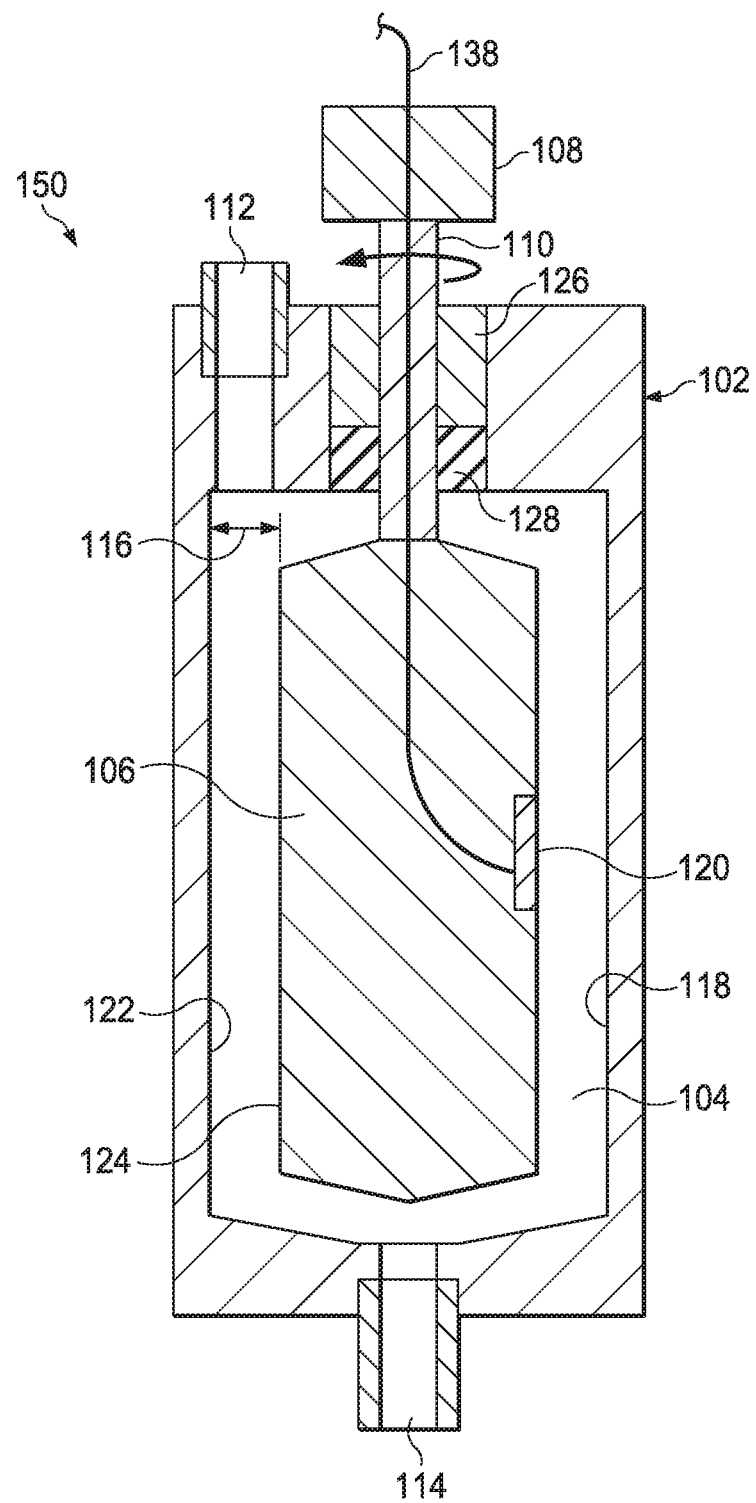

FIG. 1B is a cross-sectional view of an illustrative FAD 150. The FAD 150 is virtually identical to the FAD 100 of FIG. 1A and includes the same components. However, the FAD 150 differs from the FAD 100 in that the FAD 150 relocates the shear stress sensor 120 inside the agitator 106 such that it is exposed to the surface 124. The cable 138 is routed through the agitator 106, the shaft 110, and out the motor 108, as depicted. Although not expressly depicted, in some examples, a slip ring is used to provide the cable 138 to the shear stress sensor 120. The operation of the FAD 150 is similar to that of FAD 100.

Figure 2:
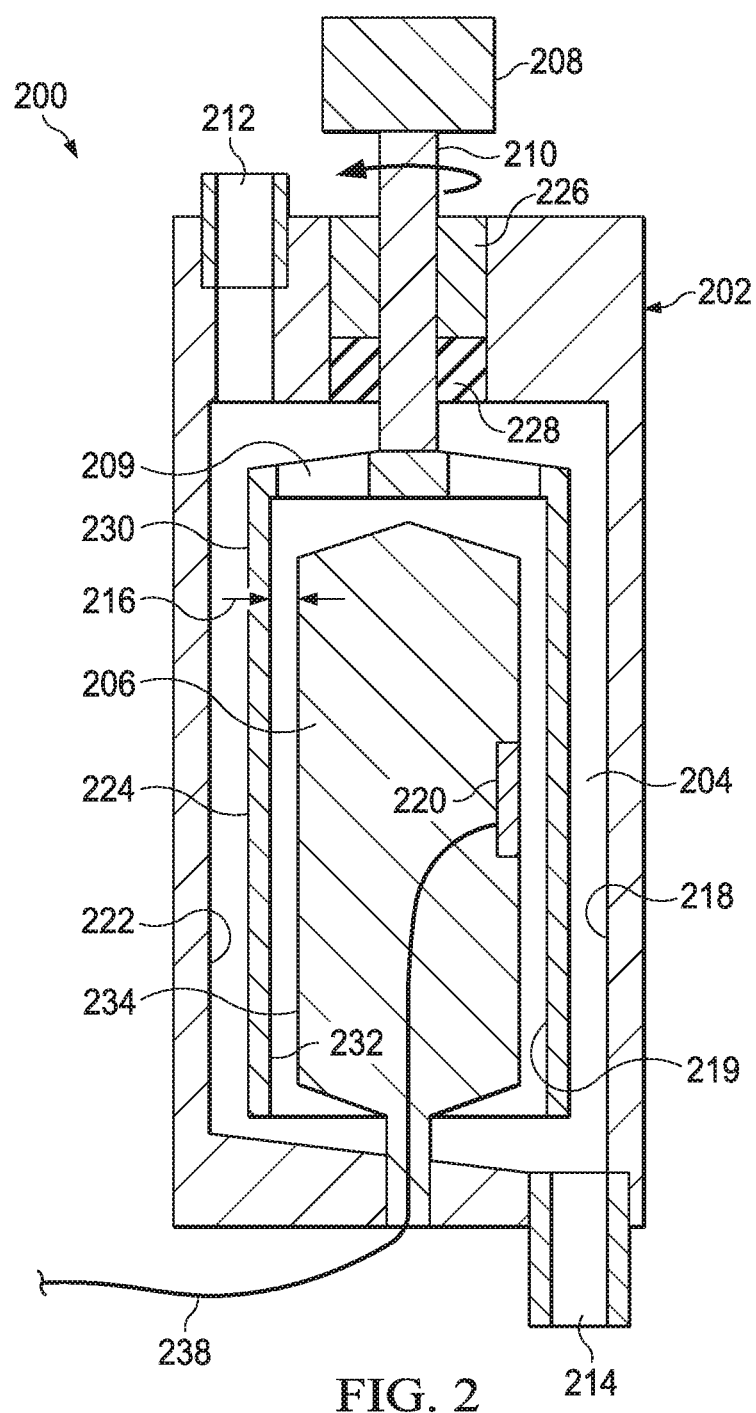

FIG. 2 is a cross-sectional view of an illustrative FAD 200, in accordance with various examples. The FAD 200 is similar to the FAD 100, but the FAD 200 additionally comprises a sleeve that agitates the fluid within the fluid cavity. The FAD 200 also comprises a stationary bob within the sleeve and in which a shear stress sensor is positioned. These features are explained in greater detail below.

In particular, the FAD 200 comprises a fluid chamber 202 having a fluid cavity 204. The fluid cavity 204 houses a stationary bob 206. The fluid cavity 204 also comprises an agitator 230 (e.g., a sleeve) that houses the stationary bob 206 and that couples to and is rotated by a motor 208 via a shaft 210. The agitator 230 includes an outer surface 224 and also includes orifices 209 through which fluid from the fluid cavity 204 may enter the interior of the agitator 230 and come into contact with the bob 206. The shaft 210 abuts a bearing assembly 226, and a seal assembly 228 prevents fluid leakage from the fluid cavity 204. The bob 206 is separated from an inner surface 232 of the agitator 230 by a distance 216, which, in combination with the speed at which the agitator 230 is rotated, determines the shear rate imparted to fluid in the fluid cavity 204. In some examples, the same distance 216 separates the bob 206 from an inner surface 219, meaning that the bob 206 is centered in the agitator 230. (Because the agitator 230 is generally cylindrical, the surfaces 232, 219 are the same inner surface of the agitator 230, but separate numerals are provided to distinguish separate halves of the inner surface to facilitate a description of the position of the bob 206 within the agitator 230.) In some examples, the bob 206 and the agitator 230 are centered in the fluid cavity 204, meaning that the bob 206 is equidistant from inner surfaces 218, 222, and that the agitator 230 is likewise equidistant from inner surfaces 218, 222. The scope of this disclosure, however, is not limited as such, and any bob position is included in the scope of this disclosure.

The fluid chamber 202 further comprises a fluid inlet 212, which may couple to a fluid source, such as a pump. The fluid chamber 202 also comprises a fluid outlet 214, which may couple to a fluid repository, such as the pump or a container from which the pump draws fluid.

A shear stress sensor 220 (e.g., a MEMS shear stress sensor) is exposed to an outer surface 234 of the bob 206. A cable 238 couples to the shear stress sensor 220 to facilitate communication between the shear stress sensor 220 and electronics (e.g., a computer) that stores and/or processes the measurements received from the shear stress sensor 220. The cable 238 is conveyed external to the FAD 200 via a shaft 236.

In operation, the fluid inlet 212 conveys fluid into the fluid cavity 204. The motor 208 rotates the agitator 230 via the shaft 210 (e.g., under the control of the electronics or computer coupled to the cable 238). Fluid is conveyed from the fluid cavity 204 into the agitator 230 via the orifices 209. The motor 208 rotates the agitator 230 at a known, controlled speed, which, depending on the distance 216, imparts a known, controlled shear rate on the fluid. This, in turn, produces a shear stress on the sensing surface of the shear stress sensor 220. The shear stress sensor 220 measures the shear stress and outputs an electrical signal indicating the measured shear stress to the cable 238. Fluid may exit the fluid cavity 204 via the fluid outlet 214. The cable 238 may couple to electronics (e.g., a computer) that has the same or similar capabilities as those described above for the electronics or computer to which the cable 138 (FIG. 1) couples.

Figure 3A:
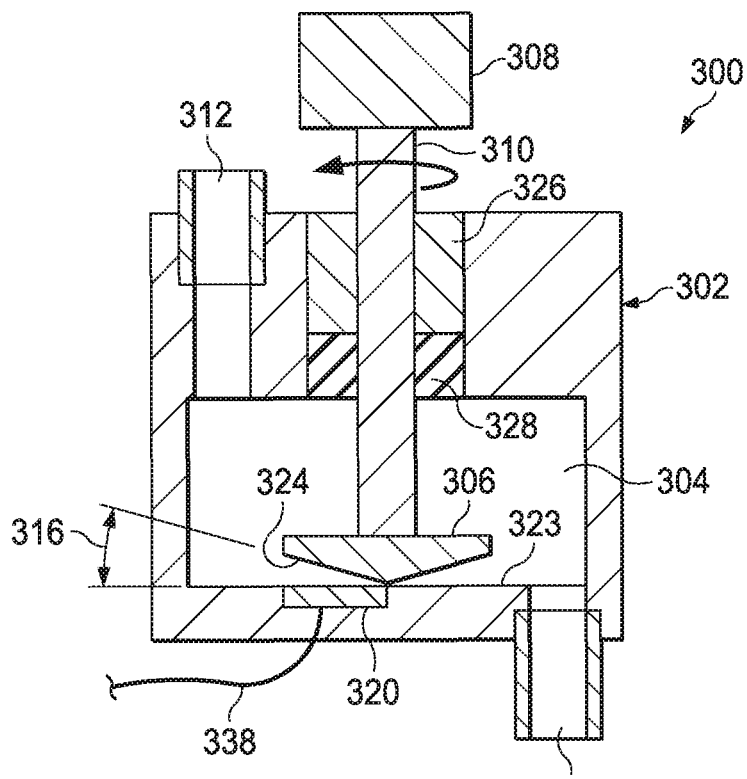

FIG. 3A is a cross-sectional view of an illustrative FAD 300, in accordance with various examples. The FAD 300 comprises a fluid chamber 302 housing a fluid cavity 304. An agitator 306 within the fluid cavity 304 couples to and is rotated by a motor 308 via a shaft 310. A fluid inlet 312 couples to the fluid cavity 304 and conveys fluid into the fluid cavity 304. A fluid outlet 314 couples to the fluid cavity 304 and conveys fluid out of the fluid cavity 304. The fluid inlet 312 may couple to a fluid source, such as a pump. The fluid outlet 314 may couple to a fluid repository, such as the pump or a container from which the pump draws fluid. A bearing assembly 326 abuts the shaft 310, and a seal assembly 328 prevents fluid leakage out of the fluid cavity 304. The fluid cavity 304 has a bottom surface 323. A shear stress sensor (e.g., a MEMS shear stress sensor) 320 is exposed to the surface 323. A cable 338 couples to the shear stress sensor 320 and to electronics (e.g., a computer) that are configured to perform some or all of the actions described above with respect to the electronics or computer coupled to cable 138 (FIG. 1).

Figure 3B:
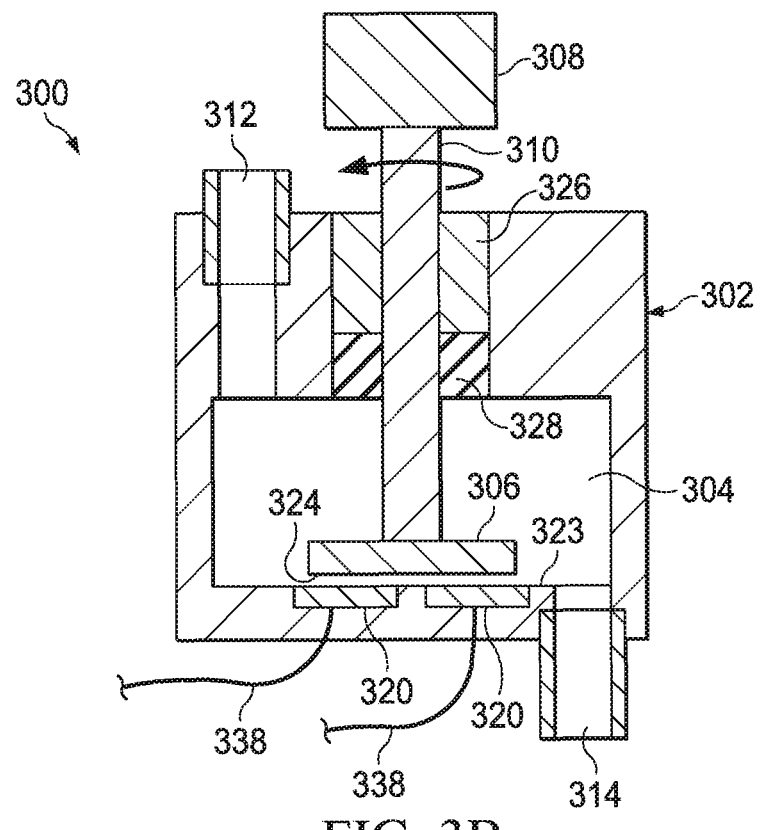

In examples, the agitator 306 has a cone shape, such that the agitator 306 and the surface 323 form a cone-and-plate configuration. One technical advantage associated with this configuration is homogenous shear flow within the gap between the agitator 306 and the surface 323. Thus, in some examples, only a single shear stress sensor 320 is needed to obtain an accurate shear stress measurement that is representative of shear stress in the gap. Other configurations are contemplated, for example, the plate-and-plate configuration of FIG. 3B, in which the agitator 306 is a rectangular prism and extends parallel to the surface 323. In this configuration, the shear rate varies across the gap between the agitator 306 and the surface 323. Thus, in such configurations, multiple shear stress sensors 320 may be exposed to the surface 323, as shown in FIG. 3B, to improve measurement accuracy.

The operation of the FAD 300 of FIG. 3A is now described. Fluid is conveyed into the fluid cavity 304 via the fluid inlet 312. The motor 308 rotates the agitator 306 at a known, controlled rate, thereby producing a known, controlled shear rate that is a function of the angle 316 between the surfaces 323 and 324. This imparts shear stress(es) on the sensing surface(s) of the shear stress sensor(s) 320, which measure(s) the shear stress(es) and output(s) electrical signals on the cable(s) 338 indicating the measured shear stress(es). Fluid is conveyed out of the fluid cavity 304 via fluid outlet 314. Electronics (e.g., a computer) that couple to the cable(s) 338 receive the shear stress measurements and process them, for example as described above with respect to the electronics or computer coupled to the cable 138 (FIG. 1). In some examples, such electronics or computer controls the motor 308, although the scope of this disclosure is not limited as such. The example shown in FIG. 3B operates in a similar manner.

Figure 4:
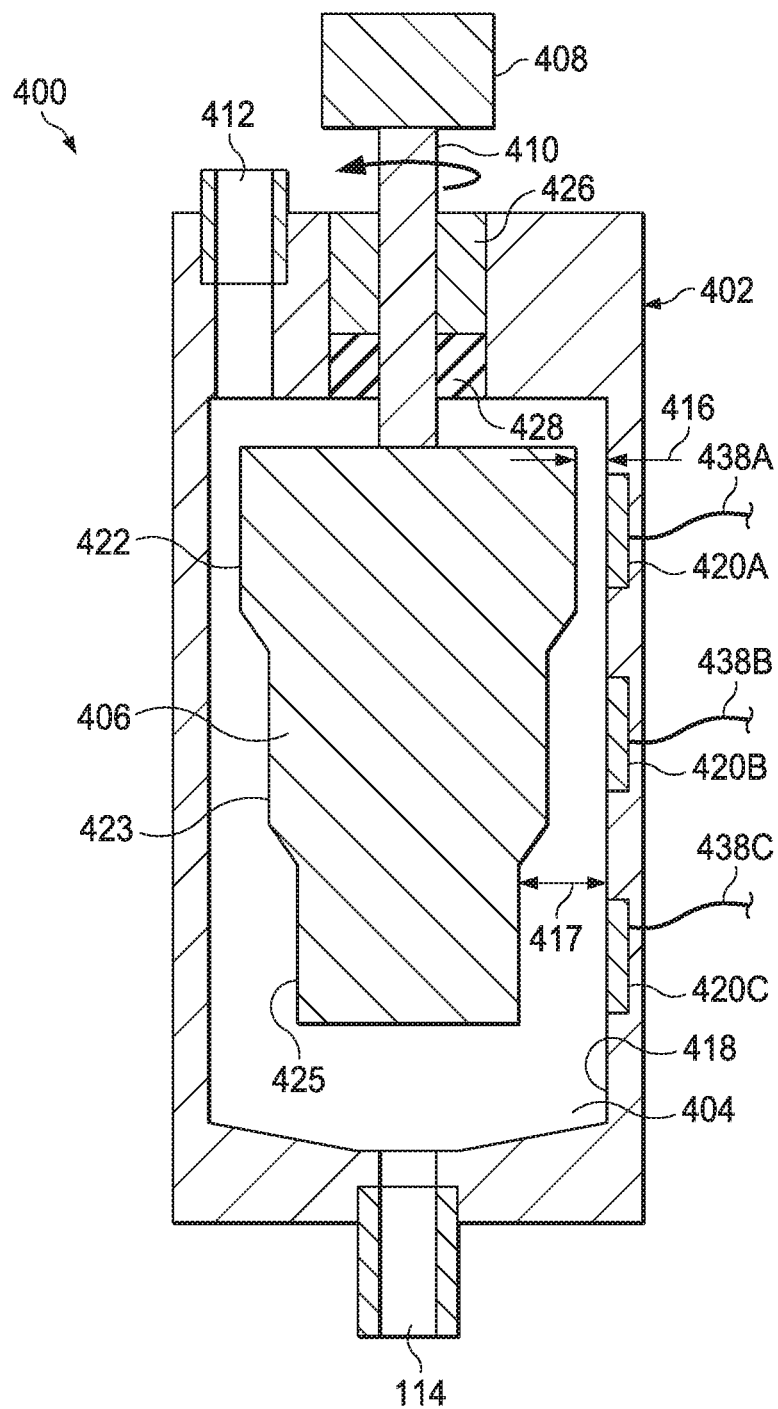

FIG. 4 is a cross-sectional view of an illustrative FAD 400, in accordance with various examples. The structure and operation of the FAD 400 is generally similar to the FAD 100 of FIG. 1A, with like numerals corresponding to like components. However, the FAD 400 differs from the FAD 100 in that the FAD 400 includes an agitator 406 having a different shape than the agitator 106—specifically, the agitator 406 has multiple diameters as shown. Surface 422 is associated with the widest diameter of the agitator 406; surface 423 is associated with the second-widest diameter of the agitator 406; and the surface 425 is associated with the smallest diameter of the agitator 406. The FAD 400 further includes multiple sensors 420A-420C aligned with surfaces 422, 423, and 425, respectively. The sensors 420A-420C couple to cables 438A-438C, respectively. The design of the FAD 400 is advantageous because rotating the agitator 406 at a single speed produces different shear rates corresponding to the different distances between the agitator 406 and the sensors 420A-420C at surfaces 422, 423, and 425. For example, the distance 417 between the surface 425 and the corresponding sensor 420C is relatively large, and so the shear rate will be smaller. In contrast, the distance 416 between the surface 422 and the corresponding sensor 420A is relatively small, and so the shear rate will be greater. These differing shear rates are obtained even when the agitator 406 is rotated at a single rotation speed. Any number of agitator diameters may be implemented, and thus rotating the agitator 406 at a single speed can instantaneously produce a wealth of information (e.g., a shear rate-shear stress graph can be produced instantaneously).

Figure 5:
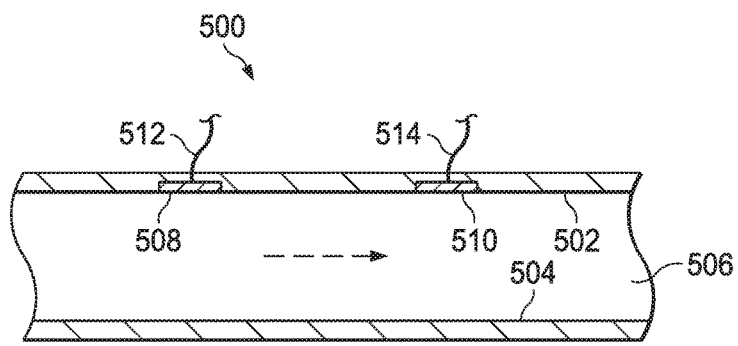

FIG. 5 depicts a cross-sectional view of a FAD 500, in accordance with various examples. The FAD 500 comprises an open-ended tube that includes a surface 502 and a surface 504. A shear stress sensor (e.g., MEMS shear stress sensor) 508 is exposed to the surface 502, and a shear stress sensor (e.g., MEMS shear stress sensor) 510 is also exposed to the surface 502. (Because the FAD 500 is a cylinder, the surfaces 502, 504 are the same surface, but they are denoted using separate numerals to denote surfaces of separate halves of the FAD 500 so that the placement of the shear stress sensors is more readily described.) In at least some examples, the diameter of the FAD 500 is approximately constant through the length of the FAD 500. Cables 512, 514 couple to shear stress sensors 508, 510 and provide outputs from the shear stress sensors 508, 510 to electronics (e.g., a computer), such as that described below with respect to FIG. 7. The FAD 500 further comprises a fluid cavity 506.

In operation, fluid flows through the fluid cavity 506 from one end toward the other end at a known, controlled flow rate. The known, controlled flow rate produces a known, controlled shear rate, and this shear rate produces shear stress on the sensing surfaces of the shear stress sensors 508, 510. The shear stress sensors 508, 510 measure the shear stress and output electrical signals indicating the measurements on cables 512, 514. The shear stress measurements may be used to calculate rheology parameters typically used in hydraulic simulations, such as in the DFG® or DFG_RT® software packages produced by HALLIBURTONO. As with the other examples of FADs described herein, the downhole conditions may be simulated with respect to the FAD 500 by preheating or cooling the fluid to a desired testing temperature by employing a thin-walled FAD 500, heating or cooling the fluid through the thin walls of the FAD 500, and recycling the fluid such that intentional heat gains or losses may be compounded.

Figure 6:
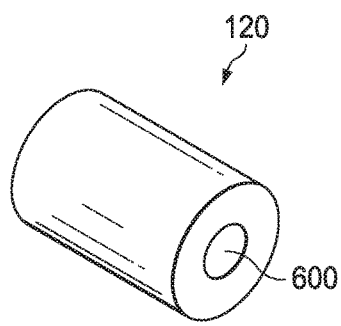
FIG. 6 is a perspective view of a shear stress sensor, in accordance with various examples.

FIG. 6 is a perspective view of a shear stress sensor 120, in accordance with various examples. The shear stress sensor 120 depicted in FIG. 6 is also representative of the shear stress sensors 220, 320, 420, 427, 429, 508, and 510 described above. The shear stress sensor 120 includes a sensing surface 600 which, when exposed to fluid, measures the shear stress present in the fluid at the sensing surface 600. The shear stress sensor 120 then outputs an electrical signal indicating the measured shear stress. As explained above, in some examples, the shear stress sensor 120 is a DIRECTSHEAR® sensor manufactured by $IC^2$® of Gainesville, Fla. In some examples, the thickness of the shear stress sensor 120 as measured from the sensing surface 600 to the opposing, parallel surface of the shear stress sensor 120 is, e.g., less than or equal to 25 millimeters.

FIG. 7 is a schematic diagram of processing logic 700 implemented in electronics (e.g., a computer) that may couple to the various shear stress sensors described herein and depicted in the accompanying drawings. The processing logic 700 includes a central processing unit (CPU) 701 that couples to memory 702 (e.g., random access memory, read-only memory), as shown in FIG. 7. In at least some such examples, the memory 702 stores computer-executable code 704, which, when executed by the CPU 701, causes the CPU 701 to perform some or all of the functions described herein, including the functions described below with reference to FIG. 8. In some examples, the processing logic 700 comprises a field programmable gate array ("FPGA"), which may be programmed using an appropriate bitstream to cause it to perform some or all of the functions described herein. In some examples, the processing logic 700 comprises a combination of an FPGA and the components depicted in FIG. 7, with the combination operating in tandem to perform some or all of the functions described herein. Any and all such combinations are contemplated and included in the scope of this disclosure.

Figure 8:
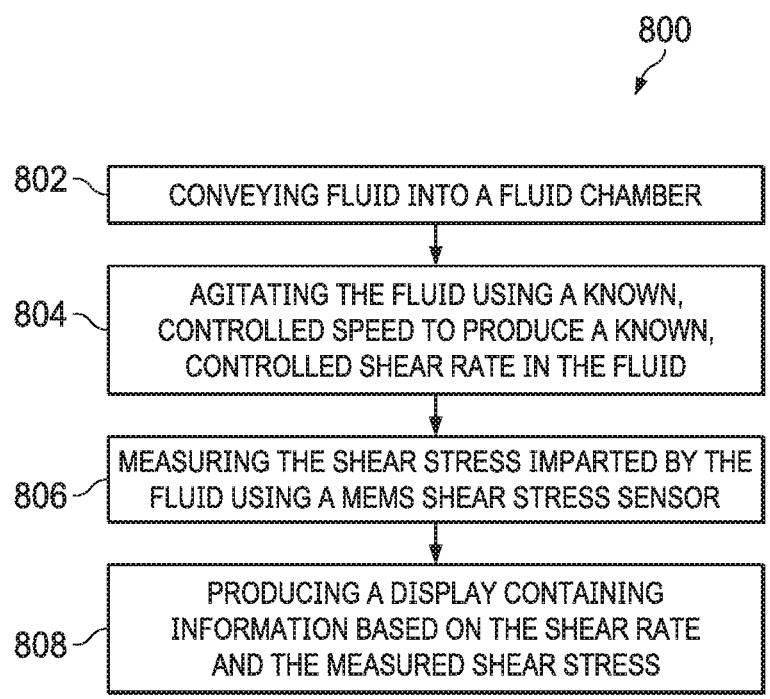
FIG. 8 is a flow diagram of an illustrative method to measure viscosity using the fluid analysis devices described herein, in accordance with various examples.

FIG. 8 is a flow diagram of an illustrative method 800 of using the FADs described herein, in accordance with various examples. The method 800 begins by conveying fluid into a fluid chamber (step 802) and agitating the fluid using a known, controlled speed to produce a known, controlled shear rate in the fluid (step 804). Such agitation may be accomplished using any of the FADs described above or using other devices and techniques not expressly described herein. The method 800 further comprises measuring the shear stress imparted by the fluid using a MEMS shear stress sensor (step 806). The MEMS shear stress sensor measures the shear stress imparted on a sensing surface of the MEMS shear stress sensor by the agitated fluid. The method 800 then comprises producing a display containing information based on the shear rate and the measured shear stress (step 808). As explained above, such information may include, e.g., a shear rate-shear stress curve, a viscosity calculation, one or more models, simulations produced using one or more models, etc. Viscosity may be calculated using the measured shear stress by the following formula:

$$\eta = \frac{\tau}{\dot{\gamma}}$$

where:
η=viscosity in Pascal—seconds
τ=shear stress measurement in Newtons per meter squared
$\dot{\gamma}$=shear rate in 1/s $$\dot{\gamma} = \frac{2R_2^2}{R_2^2 - R_1^2}\Omega,$$

for an inner cylinder rotation $$\dot{\gamma} = \frac{2R_1^2}{R_2^2 - R_1^2}\Omega,$$

for an outer cylinder rotation
where:
R1=inner cylinder radius in meters
R2=outer cylinder radius in meters
Ω=Rotation in radians per second Similarly, in the case of a highly viscous fluid (e.g., a gel), similar techniques may be employed to determine the yield stress associated with that highly viscous fluid. For example, the FAD may attempt to rotate its agitator until the highly viscous fluid gives way, and the shear stress measured at that time may indicate the yield stress associated with that fluid.

In the foregoing discussion and in the claims, the terms "including" and "comprising" are used in an open-ended fashion, and thus should be interpreted to mean "including, but not limited to . . . ." Unless otherwise stated, "about," "approximately," or "substantially" preceding a value means+/−10 percent of the stated value. The above discussion is meant to be illustrative of the principles and various examples of the present disclosure. Numerous variations and modifications will become apparent to those skilled in the art once the above disclosure is fully appreciated. It is intended that the following claims be interpreted to embrace all such variations and modifications.

In some examples, a fluid analysis device (FAD) comprises a fluid chamber comprising an agitator and a shear stress sensor exposed to a surface within the fluid chamber. The device may be supplemented using one or more of the following concepts, in any order and in any combination: wherein the shear stress sensor comprises a micro-electro-mechanical system (MEMS) shear stress sensor; wherein the surface is an inner surface of an outermost wall of the fluid chamber; wherein the agitator comprises a bob; wherein the agitator comprises a sleeve, and wherein the FAD comprises a bob positioned inside the sleeve; wherein the surface is a surface of the bob; wherein the bob comprises first and second surfaces corresponding to different diameters of the bob, wherein the shear stress sensor is aligned with the first surface, and wherein the FAD comprises another shear stress sensor aligned with the second surface; wherein the agitator comprises a cone-and-plate configuration; wherein the agitator comprises a plate-and-plate configuration; wherein the agitator is housed within the fluid chamber; wherein the fluid chamber is the agitator; wherein the FAD comprises a fluid inlet to the fluid chamber and a fluid outlet from the fluid chamber, the fluid outlet being separate from the fluid inlet; wherein the shear stress sensor is exposed to a surface of the agitator.

In some examples a fluid analysis device (FAD) comprises an open-ended tube and a micro-electro-mechanical system (MEMS) shear stress sensor exposed to an interior surface of the open-ended tube. The device may be supplemented using the following concept: further comprising a second MEMS shear stress sensor exposed to the interior surface of the open-ended tube.

In some examples, a method comprises conveying fluid into a fluid chamber agitating the fluid to produce a shear rate in the fluid; measuring a shear stress imparted by the fluid using a micro-electro-mechanical system (MEMS) shear stress sensor and producing a display containing information based on the shear rate and the measured shear stress. The method may be supplemented using one or more of the following concepts, in any order and in any combination: wherein the agitating is performed by an agitator housed within the fluid chamber; wherein the MEMS shear stress sensor is exposed to an interior surface of the fluid chamber; wherein the MEMS shear stress sensor is exposed to an exterior surface of a bob, the bob housed within the fluid chamber; wherein the fluid chamber comprises an open-ended tube, and wherein the MEMS shear stress sensor is exposed to an interior surface of the open-ended tube.

What is claimed is:

1. A fluid analysis device (FAD), comprising:
   a fluid chamber comprising an agitator, wherein the agitator comprises a rotating bob; and
   a micro-electro-mechanical system (MEMS) shear stress sensor having a fluid contact surface exposed to an opposing surface within the fluid chamber, wherein the MEMS shear stress sensor is positioned in a recess located on an outer surface the agitator such that the fluid contact surface is positioned about flush with the outer surface of the agitator.

2. The FAD of claim 1, wherein the FAD comprises a fluid inlet to the fluid chamber and a fluid outlet from the fluid chamber, the fluid outlet being separate from the fluid inlet.

3. A fluid analysis device (FAD), comprising:
   a fluid chamber comprising an agitator; and
   a micro-electro-mechanical system (MEMS) shear s tress sensor exposed to a surface within the fluid chamber, wherein the MEMS shear stress sensor is positioned on the agitator, wherein the agitator comprises a rotating sleeve with a stationary bob positioned inside the rotating sleeve, wherein the MEMS is positioned on the bob.

4. A fluid analysis device (FAD), comprising:
   a fluid chamber comprising an agitator; and
   a shear stress sensor exposed to a surface within the fluid chamber,
   wherein the agitator comprises a sleeve,
   wherein the FAD comprises a bob positioned inside a sleeve,
   wherein the bob comprises first and second surfaces corresponding to different diameters of the bob, wherein the shear stress sensor is aligned parallel with the first surface, and wherein the FAD comprises another shear stress sensor aligned parallel with the second surface.

* * * * *

UNITED STATES PATENT AND TRADEMARK OFFICE
CERTIFICATE OF CORRECTION

PATENT NO. : 10,697,876 B1  
APPLICATION NO. : 16/510014  
DATED : June 30, 2020  
INVENTOR(S) : Dale E. Jamison et al.

Page 1 of 1

It is certified that error appears in the above-identified patent and that said Letters Patent is hereby corrected as shown below:

In the Specification

Column 6, Line 9, replace "HALLIBURTONO" with --HALLIBURTON®--

In the Claims

Claim 3, Column 8, Line 47, replace "s tress" with --stress--

Signed and Sealed this
Eighteenth Day of August, 2020

Andrei Iancu
*Director of the United States Patent and Trademark Office*